United States Patent
Long et al.

(10) Patent No.: US 12,313,668 B1
(45) Date of Patent: *May 27, 2025

(54) BATTERY DIODE FAULT MONITORING

(71) Applicant: Wisk Aero LLC, Mountain View, CA (US)

(72) Inventors: Geoffrey Alan Long, Montara, CA (US); Jing Xue, San Jose, CA (US); Khoichi Lawrence Takayama, San Jose, CA (US)

(73) Assignee: Wisk Aero LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,234

(22) Filed: Feb. 26, 2024

Related U.S. Application Data

(63) Continuation of application No. 17/240,519, filed on Apr. 26, 2021, now Pat. No. 11,953,540, which is a continuation of application No. 16/177,255, filed on Oct. 31, 2018, now Pat. No. 11,016,140.

(51) Int. Cl.
   *G01R 31/26* (2020.01)
   *H01M 50/572* (2021.01)

(52) U.S. Cl.
   CPC ...... *G01R 31/2632* (2013.01); *H01M 50/572* (2021.01)

(58) Field of Classification Search
   None
   See application file for complete search history.

(56) References Cited

U.S. PATENT DOCUMENTS

| | | | |
|---|---|---|---|
| 6,957,048 B2 | 10/2005 | Formenti | |
| 8,686,693 B2 | 4/2014 | Bhowmik et al. | |
| 9,110,107 B2 | 8/2015 | Busca et al. | |
| 10,381,825 B2* | 8/2019 | Tung | H02J 7/0016 |
| 11,016,140 B1 | 5/2021 | Long et al. | |
| 11,186,202 B2* | 11/2021 | Sugimura | B60L 58/19 |
| 11,239,841 B1 | 2/2022 | Chen et al. | |
| 11,313,915 B2* | 4/2022 | Kondo | H02J 7/0063 |
| 11,476,677 B2* | 10/2022 | Liu | H01M 10/4257 |
| 11,671,096 B1 | 6/2023 | Chen et al. | |

(Continued)

OTHER PUBLICATIONS

U.S. Appl. No. 16/177,255, "Non-Final Office Action", Sep. 9, 2020, 9 pages.

(Continued)

*Primary Examiner* — Jermele M Hollington
(74) *Attorney, Agent, or Firm* — Kilpatrick Townsend & Stockton LLP

(57) ABSTRACT

A system is disclosed to detect failure of a diode that is connected in series with a battery and a contactor or other switch configured to connect the battery to a load when the contactor or other switch is in a closed position and to isolate the battery from the load when the contactor or other switch is in an open position. In various embodiments, the system includes a high value resistor connected between the anode terminal of the diode and ground, the connection to the anode terminal being on a load side of the contactor or other switch; and a voltage meter configured to measure a voltage across the high value resistor at least during a test in which a voltage is applied to a bus associated with the load while the contactor or other switch is in the open position.

17 Claims, 3 Drawing Sheets

(56) References Cited

U.S. PATENT DOCUMENTS

| | | | |
|---|---|---|---|
| 11,953,540 B1* | 4/2024 | Long | G01R 31/52 |
| 2010/0259856 A1 | 10/2010 | Senriuchi et al. | |
| 2017/0120771 A1 | 5/2017 | Alser et al. | |
| 2017/0256963 A1* | 9/2017 | Murray | B64G 6/00 |
| 2019/0056444 A1 | 2/2019 | Dragoi et al. | |
| 2019/0359081 A1 | 11/2019 | Erhart et al. | |
| 2024/0128736 A1* | 4/2024 | Gietzold | H02H 3/044 |

OTHER PUBLICATIONS

U.S. Appl. No. 16/177,255, "Notice of Allowance", Feb. 1, 2021, 7 pages.

U.S. Appl. No. 17/240,519, "Non-Final Office Action", Jun. 16, 2023, 11 pages.

U.S. Appl. No. 17/240,519, "Notice of Allowance", Nov. 24, 2023, 5 pages.

* cited by examiner

BATTERY DIODE FAULT MONITORING

CROSS-REFERENCES TO RELATED APPLICATIONS

This application is a continuation of U.S. application Ser. No. 17/240,519, titled "BATTERY DIODE FAULT MONITORING," filed Apr. 26, 2021, now U.S. Pat. No. 11,953,540, issued Apr. 9, 2024, which is a continuation of U.S. application Ser. No. 16/177,255, titled "BATTERY DIODE FAULT MONITORING," filed Oct. 31, 2018, now U.S. Pat. No. 11,016,140, issued May 25, 2021, each of which are hereby incorporated in their entirety and for all purposes.

BACKGROUND OF THE INVENTION

Battery-powered systems may include multiple batteries to drive multiple loads. For example, an electric aircraft or other vehicle may include a plurality of high voltage batteries that power a propulsion system comprising multiple loads, such as a plurality of electric motors. This arrangement may be used to provide redundancy and/or fault tolerance, for example.

Such a system may include contactors that are open when the propulsion system is not in use and closed just prior to use. This approach ensures safety by reducing the amount of the system that has high voltage.

The system may include diodes interposed between the respective batteries and the loads. In the case of a battery failure in which a cell fails short, the affected battery could have a substantially lower voltage than the other batteries. This would cause a large amount of current to flow from the good batteries to the bad battery and there is a risk that other structures provided to protect the other batteries, such as battery fuses, might fail or be damaged.

The diodes may also enable batteries to discharge more evenly in the scenario where each of the batteries has a different state of health.

These diodes may be deemed important to the system. Therefore, it would be useful to have a way to determine if they have failed. A possible failure mode is one in which the diode is shorted, i.e., no longer prevents current from flowing back through the diode.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques are disclosed to detect that a diode interposed between one of a plurality of batteries and a plurality of loads has failed by becoming shorted (also known as "short-circuited" or "failed closed"). In various embodiments, a high value resistor is connected between the input terminal (anode) of the diode and ground. Contactors (or other switches or connectors) associated with one or more batteries with which the diode being tested is not associated are closed. Voltage is measured across the high value resistor. If greater than a threshold voltage is detected, it is determined the diode being tested has failed "short".

Figure 1:
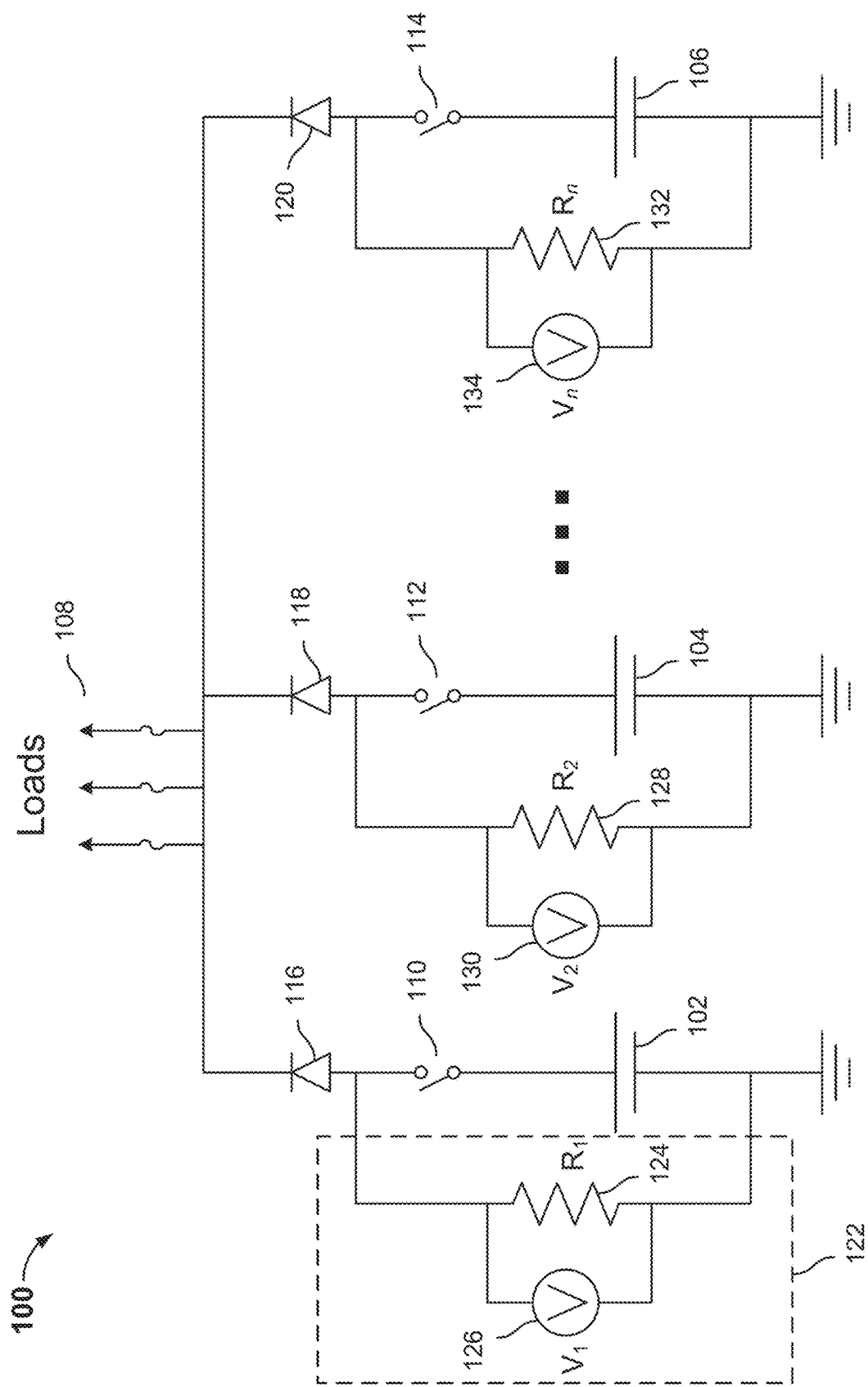
FIG. 1 is a circuit diagram illustrating an embodiment of a battery diode fault monitoring system.

FIG. 1 is a circuit diagram illustrating an embodiment of a battery diode fault monitoring system. In the example shown, battery diode fault monitoring system 100 includes a plurality of batteries, represented in FIG. 1 by batteries 102, 104, and 106. Each battery is configured to be connected to a common set of loads 108, e.g., a plurality of motors or other loads, by a corresponding contactor or other switch or connector, such as contactors 110, 112, and 114 in the example shown.

Each of the batteries (e.g., 102, 104, and 106) is protected and isolated by an associated diode, such as diodes 116, 118, and 120 in the example shown. In various embodiments, in the case of a battery failure in which a cell fails short, the affected battery could have a substantially lower voltage than the other batteries. In such a failure scenario, the diode (e.g., 116, 118, or 120) associated with the failed battery would prevent current flow from the good batteries to the bad battery. In various embodiments, the diodes 116, 118, and 120 may also enable batteries to discharge more evenly in the scenario where each of the batteries has a different state of health.

To enable failures in which one or more of the diodes 116, 118, and 120 has failed "short" to be detected, a battery diode fault detection circuit, such as fault detection circuit 122 in the example shown, is provided with respect to each battery, e.g., 102, 104, and 106. In the example shown, battery diode fault detection circuit 122 includes a high value resistor 124, e.g., a few kiloohms or so, connected between the input (anode) terminal of the diode 116 and ground. A voltage meter 126 is provided, in this example, to measure voltage across the high value resistor 124. Similarly, a battery diode fault detection circuit comprising high value resistor 128 and voltage meter 130 is provided with respect to diode 118; and a battery diode fault detection circuit comprising high value resistor 132 and voltage meter 134 is provided with respect to diode 120.

In various embodiments, battery diode fault monitoring is performed at least in part by closing one or more contactors associated with batteries corresponding to battery diodes not currently being tested while leaving open the contactor associated with the battery diode that is being tested. If the voltage across the high value resistor comprising the battery diode fault detection circuit, e.g., resistor 124 in FIG. 1, is determined to be greater than a threshold voltage, the corresponding diode, e.g., diode 116, is determined to have failed "short". The testing procedure is repeated with respect to one or more diodes not tested previously, using one or more of the other batteries, the diodes of which were tested in a previous iteration, to test the diode(s) that has/have not been tested. Once all diodes have been tested and passed, the battery diode fault monitoring procedure is determined to have been completed satisfactorily.

Figure 2:
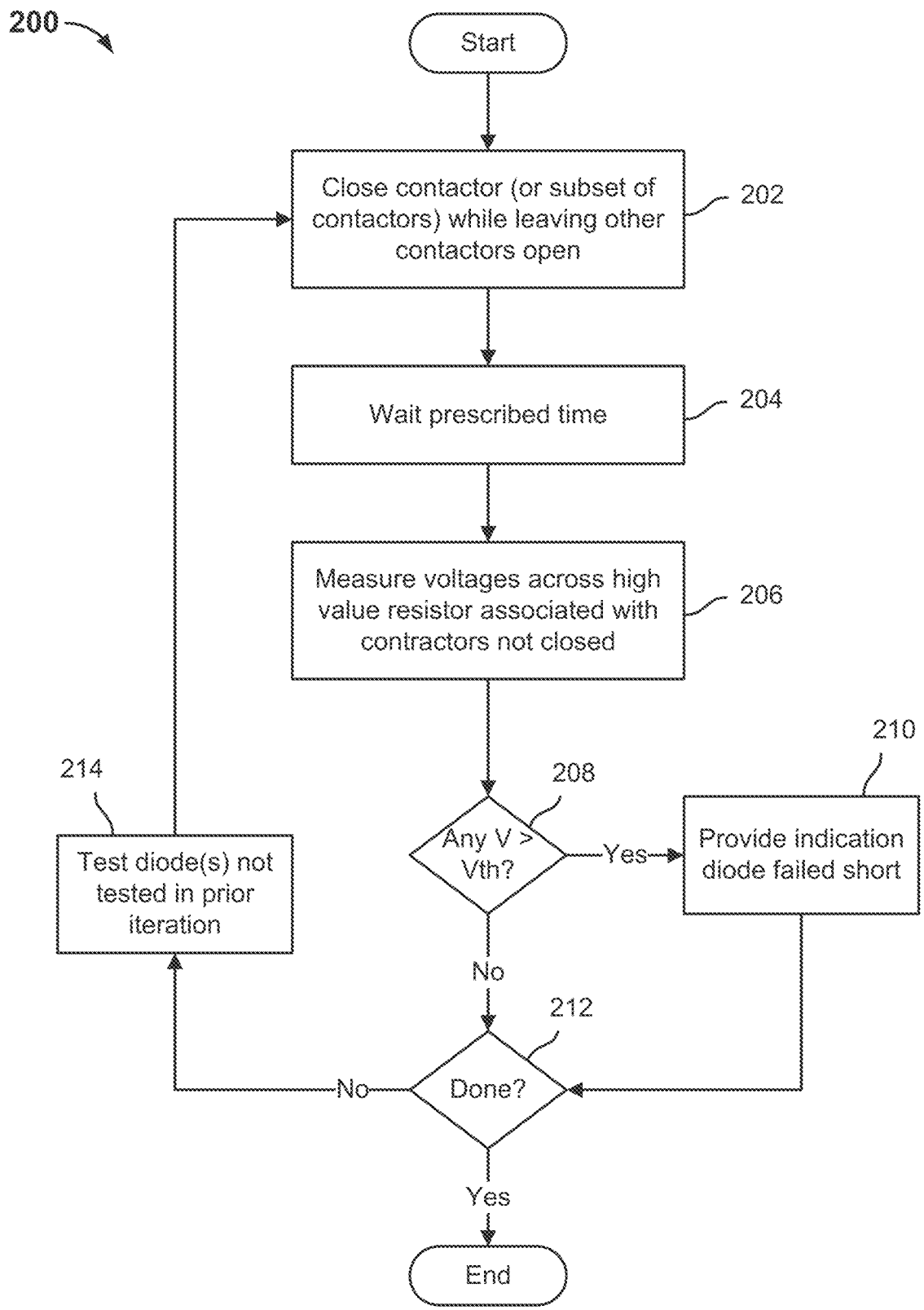
FIG. 2 is a flow chart illustrating an embodiment of an embodiment of a process to monitor a battery diode for faults.

FIG. 2 is a flow chart illustrating an embodiment of an embodiment of a process to monitor a battery diode for faults. In various embodiments, a processor, control circuit, computer, or other processing device or component may be programmed to implement the process 200 of FIG. 2 to perform battery diode fault monitoring as disclosed herein. In the example shown, a contactor associated with a battery (or a subset set of contactors associated with a subset of batteries) is/are closed while leaving one or more other contactors associated with other batteries open (202). For example, in the example shown in FIG. 1, the contactor 110 may be closed while leaving contactors 112 and 114 open. The system waits for a prescribed time (204). In various embodiments, the wait is for a time determined based at least in part on capacitances of the power distribution system. Once the prescribed time has elapsed (204), the respective voltage across each of the high value resistors associated with batteries the contactors of which were not closed, e.g., voltage meter 130 associated with resistor 128 and voltage meter 134 across resistor 132, in the example shown in FIG. 1, are read and compared to a detection threshold voltage (206). If any measure voltage exceeds the detection threshold (208), an indication is provided that the associated battery diode has failed short (210). Otherwise, processing proceeds to testing any diode(s) not tested in a previous iteration (212, 214). For example, a subsequent test in which contactor 112 is closed while leaving contactor 110 open may be performed (202). After the prescribed time (204), the voltage across resistor 124 is measured (206). If the measured voltage exceeds the detection threshold (208), an indication is provided that the associated battery diode has failed short (210). If not, and if no other diodes remain to be tested (212), the process ends.

Figure 3:
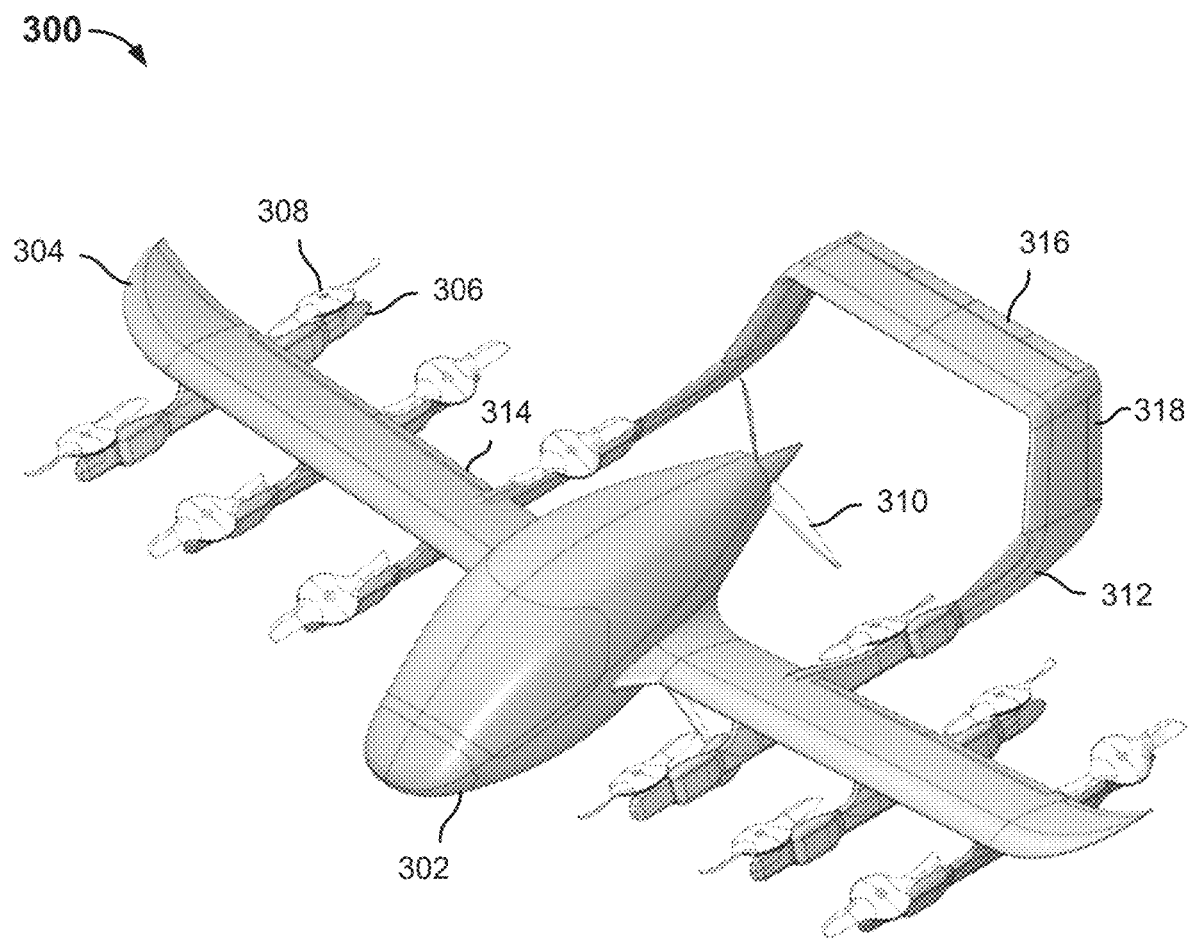
FIG. 3 is a diagram illustrating an embodiment of an electric VTOL aircraft.

FIG. 3 is a diagram illustrating an embodiment of an electric VTOL aircraft. In various embodiments, a battery diode fault monitoring system such as battery diode fault monitoring system 100 of FIG. 1 may be embodied in an aircraft such as aircraft 300 of FIG. 3. In the example shown, aircraft 300 includes a fuselage (body) 302 and wings 304. A set of three underwing booms 306 is provided under each wing. Each boom 306 has two lift fans 308 mounted thereon, one forward of the wing and one aft. Each lift fan 308 may be driven by an associated drive mechanism, such as a dedicated electric motor. A plurality of batteries (not shown in FIG. 3) may be used to drive the lift fans 308. For example, in some embodiments, batteries such as batteries 102, 104, and 106 of FIG. 1 may be used to power motors configured to rotate the lift fans 308.

In the example shown in FIG. 3, propeller 310 is mounted on the fuselage 302 and configured to push the aircraft through the air in the forward (e.g., x axis) direction. The propeller 310 is positioned between a pair of booms 312 that extend aft and are joined at their aft end by a tail structure on which aerodynamic control surfaces including elevators 316 and rudder 318 are mounted. Additional control surfaces include ailerons 314 mounted on the trailing edge of wings 304.

In various embodiments, aircraft 300 includes a flight control system that embodies an aerodynamic model generated based on a sparse set of simulation results, as disclosed herein. For a given set of desired forces and moments, the flight control system uses the model to determine a set of actuators and for each a corresponding set of actuator parameters to achieve the desired forces and moments. For example, all or a subset of actuators such as the lift fans 208 and/or selected ones of them; propeller 310; and control surfaces such as ailerons 314, elevators 316, and/or rudders 318 may be selected, and for each an associated set of parameters determined and applied (e.g., a corresponding RPM, which equates to torque, for each lift fan 308 included in the mix; position angles for each selected control surface; etc.).

In various embodiments, a plurality of batteries may be provided to power motors associated with the respective lift fans 308. Each battery may be protected by a diode, such as diodes 116, 118, and 120 of FIG. 1. In various embodiments, each diode is monitored by an associated battery diode fault detection circuit, such as battery diode fault detection circuit 122 of FIG. 1. A flight control or other monitoring system comprising the aircraft 300 may be used in various embodiments to monitor for battery diode failure as disclosed herein. For example, the flight control or other monitoring system may be configured to perform the process 200 of FIG. 2 to detect diode failure.

In various embodiments, techniques disclosed herein may enable a battery diode failure in which the diode has failed "short" to be detected.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A power system, comprising:
 a load node;
 a power source, comprising:
  a battery,
  a switch, connected to the battery, and
  a diode, connected to the switch and to the load node; and
 a processor, configured to:
 selectively control the switch to electrically connect the battery to the load node, and
 test the diode to detect whether a short condition exists in the diode while the battery is electrically isolated from the load node.

2. The power system of claim 1, wherein the processor is further configured to test the diode by measuring a current conducted by the diode, and to determine that the diode is faulty in response to the measured current being greater than a threshold.

3. The power system of claim 1, wherein the processor is configured to test the diode while another battery is electrically connected to the load node.

4. The power system of claim 1, further comprising:
a resistor connected between the diode and a ground, wherein the processor is further configured to measure voltage across the resistor while the battery is electrically isolated from the load node, and to detect the short condition in the diode based at least in part on a determination that the measured voltage exceeds a detection threshold voltage.

5. The power system of claim 4, further comprising:
a voltage meter configured to measure the voltage across the resistor at least during a test while the switch is in an open position, wherein the processor measures the voltage across the resistor via the voltage meter.

6. The power system of claim 4, wherein the resistor is connected to the diode on a load side of the switch.

7. The power system of claim 1, further comprising one or more additional power sources, each additional power source comprising:
an additional battery,
an additional switch, connected to the additional battery, and
an additional diode, connected to the additional switch and to the load node,
wherein the processor is further configured to test the additional diode of each particular additional power source while the additional battery of the particular additional power source is electrically isolated from the load node.

8. An electric vehicle comprising the power system of claim 1.

9. The electric vehicle of claim 8, wherein the electric vehicle includes an aircraft.

10. The electric vehicle of claim 9, wherein the processor is incorporated in a flight control system of the aircraft.

11. An electric aircraft comprising:
a plurality of lift fans each associated with a motor;
a plurality of power sources that power the plurality of lift fans, each power source comprising:
a battery,
a switch, connected to the battery, and
a diode, connected to the switch and to the plurality of lift fans, and
a processor configured to test the diode of each particular power source while the battery of the particular power source is electrically isolated from the plurality of lift fans.

12. A method of testing a diode of a power system, the method comprising:
identifying, with a processor, that a first diode interposed between a first battery and a load node has not yet been tested;
controlling, with the processor, a switch to electrically connect a second battery to the load node;
testing the first diode with the processor to detect whether a short condition exits in the first diode while the first battery is electrically isolated from the load node;
identifying, with the processor, that a second diode interposed between the second battery and the load node has not yet been tested to detect to detect whether a short condition exits in the second diode; and
testing the second diode with the processor to detect to detect whether a short condition exits in the second diode while the second battery is electrically isolated from the load node.

13. The method of claim 12, further comprising:
repeating testing for all available diodes until determining that all diodes have been tested.

14. The method of claim 12, further comprising:
testing the first diode with the processor by measuring a current conducted by the first diode, and
determining, with the processor, that the first diode is faulty in response to the measured current being greater than a threshold.

15. The method of claim 12, wherein testing the first diode further comprises:
measuring, with the processor, a voltage across a resistor connected between the first diode and a ground while the first battery is electrically isolated from the load node;
comparing, with the processor, the voltage to a detection threshold voltage; and
detecting, with the processor, the short condition in the first diode based at least in part on a determination that the voltage exceeds the detection threshold voltage.

16. The method of claim 15, wherein the resistor is connected to the diode on a load side of the switch.

17. The method of claim 12, wherein the power system is incorporated in an electric vehicle.

* * * * *